(12) United States Patent
Lee et al.

(10) Patent No.: US 9,037,431 B2
(45) Date of Patent: May 19, 2015

(54) APPARATUS AND METHOD FOR COMPUTING COUPLING NOISE VOLTAGE OCCURRING IN FLASH MEMORY DEVICE

(75) Inventors: Jae-Jin Lee, Seoul (KR); Dong-Hyuk Park, Seoul (KR)

(73) Assignee: Foundation of Soongsil—University Industry Cooperation, Seoul (KR)

(*) Notice: Subject to any disclaimer, the term of this patent is extended or adjusted under 35 U.S.C. 154(b) by 788 days.

(21) Appl. No.: 13/281,143

(22) Filed: Oct. 25, 2011

(65) Prior Publication Data

US 2012/0278019 A1 Nov. 1, 2012

(30) Foreign Application Priority Data

Nov. 8, 2010 (KR) .................. 10-2010-0110207
Jun. 23, 2011 (KR) .................. 10-2011-0061392

(51) Int. Cl.
| | |
|---|---|
| G11C 29/26 | (2006.01) |
| G11C 29/56 | (2006.01) |
| G11C 29/52 | (2006.01) |
| G11C 16/34 | (2006.01) |
| G11C 11/56 | (2006.01) |
| G11C 29/24 | (2006.01) |
| G11C 29/50 | (2006.01) |
| G11C 16/00 | (2006.01) |

(52) U.S. Cl.
CPC ........ *G11C 16/3422* (2013.01); *G11C 11/5628* (2013.01); *G11C 16/00* (2013.01); *G11C 29/24* (2013.01); *G11C 29/50* (2013.01); *G11C 2029/5002* (2013.01)

(58) Field of Classification Search
CPC ............. G01R 29/26; G01R 31/31709; G01R 31/31725; G01R 31/31937; G01R 31/3004; G11C 29/26; G11C 29/52; G11C 29/56; G11C 2029/5004

USPC .......................................................... 702/69
See application file for complete search history.

(56) References Cited

U.S. PATENT DOCUMENTS

| | | | | |
|---|---|---|---|---|
| 6,044,019 | A | * | 3/2000 | Cernea et al. ............ 365/185.21 |
| 6,621,739 | B2 | * | 9/2003 | Gonzalez et al. ........ 365/185.21 |
| 2008/0067388 | A1 | * | 3/2008 | Grimberg ................... 250/338.1 |
| 2009/0175064 | A1 | * | 7/2009 | Yamada et al. ................. 365/72 |
| 2010/0103725 | A1 | * | 4/2010 | Kim et al. ..................... 365/163 |
| 2012/0026788 | A1 | * | 2/2012 | Shalvi et al. ............. 365/185.02 |

FOREIGN PATENT DOCUMENTS

KR  10-2008-0085409 A   9/2008

OTHER PUBLICATIONS

Asia-Pacific Data Storage Conference (APDSC'10) Oct. 27, 2010-Oct. 29, 2010.

* cited by examiner

*Primary Examiner* — John Breene
*Assistant Examiner* — Lynda Dinh
(74) *Attorney, Agent, or Firm* — TechLaw LLP (57) ABSTRACT

An apparatus for computing a coupling noise voltage occurring in a plurality of cells arranged on a plurality of word lines and a plurality of bit lines in a flash memory device includes: a coupling ratio computing unit and a coupling voltage computing unit. The coupling ratio computing unit can compute coupling ratios between a cell and neighboring cells wherein each of the coupling ratios have a value such that the difference between two coupling noise voltage values is minimized. The coupling voltage computing unit computes the coupling noise voltage value occurring in the cell using the computed coupling ratios.

20 Claims, 5 Drawing Sheets

APPARATUS AND METHOD FOR COMPUTING COUPLING NOISE VOLTAGE OCCURRING IN FLASH MEMORY DEVICE

CROSS-REFERENCE TO RELATED APPLICATION

The present invention claims the benefit of Korean Patent Application No. 10-2010-0110207 filed in Korea on Nov. 8, 2010, and Korean Patent Application No. 10-2011-0061392 filed in Korea on Jun. 23, 2011, which is hereby incorporated by reference for all purposes as if fully set forth herein.

BACKGROUND OF THE INVENTION

1. Field of the Invention

The present invention relates to apparatus and method for computing a coupling noise voltage occurring in cells in a flash memory device.

2. Discussion of the Related Art

As the use of memory devices for portable devices, such as a digital camera, a digital music player, a personal digital assistant (PDA), an e-book, a smart phone and a tablet PC, increases, interest in a flash memory device including multi-level cells (e.g., floating gate MOS transistors), as a high-density flash memory device that is capable of storing plenty of data over a relatively small area increases.

Since multi-level cell is capable of storing data of 2 bits or more into a cell, the flash memory device including the multi-level cell has the advantage of remarkably reducing bit cost compared to a flash memory device including a single-level cell. A threshold voltage is set for each multi-level cell, and due to the threshold voltage, data of 2 bits or more can be stored in each multi-level cell.

However, there is a disadvantage that little margin is left for the threshold voltage. Accordingly, it is problematic that programming performance of the flash memory device including the multi-level is worse than that of the flash memory including the single-level cell and a coupling noise voltage occurs in each cell.

SUMMARY OF THE INVENTION

Accordingly, the present invention is directed to apparatus and method for computing a coupling noise voltage occurring in a flash memory device which substantially obviates one or more of the problems due to limitations and disadvantages of the related art.

An advantage of the present invention is to provide apparatus and method that can accurately compute a coupling noise voltage occurring in multi-level cells of a flash memory device.

Additional features and advantages of the present invention will be set forth in the description which follows, and in part will be apparent from the description, or may be learned by practice of the invention. These and other advantages of the invention will be realized and attained by the structure particularly pointed out in the written description and claims thereof as well as the appended drawings.

To achieve these and other advantages and in accordance with the purpose of the present invention, as embodied and broadly described herein, an apparatus for computing a coupling noise voltage occurring in a plurality of cells arranged on a plurality of word lines and a plurality of bit lines in a flash memory device includes: a coupling ratio computing unit that computes K coupling ratios between a cell located at a coordinate [i, j] and K neighboring cells to the cell at [i, j], wherein K is an integer of 1 or more; and a coupling noise voltage computing unit that computes a coupling noise voltage value occurring in the cell at [i, j] using the K coupling ratios, wherein each of the K coupling ratios has a value such that a difference value between a first coupling noise voltage value and a second coupling noise voltage value is minimized, wherein the first coupling noise voltage is computed using a voltage value of a test cell at a coordinate [i, j] among a plurality of test cells in a test flash memory device and the second coupling noise voltage value is computed using K first voltage variation values of K neighboring test cells to the test cell at [i, j] and the K coupling ratios.

In another aspect, a method for computing a coupling noise voltage occurring in a plurality of cells arranged on a plurality of word lines and a plurality of bit lines in a flash memory device includes: computing K coupling ratios between a cell located at a coordinate [i, j] and K neighboring cells to the cell at [i, j], wherein K is an integer of 1 or more; and computing a coupling noise voltage value occurring in the cell at [i, j] using the K coupling ratios, wherein each of the K coupling ratios has a value such that a difference value between a first coupling noise voltage value and a second coupling noise voltage value is minimized, wherein the first coupling noise voltage is computed using a voltage value of a test cell at a coordinate [i, j] among a plurality of test cells in a test flash memory device and the second coupling noise voltage value is computed using K first voltage variation values of K neighboring test cells to the test cell at [i, j] and the K coupling ratios.

In another aspect, a computer-readable recoding medium holds a program executing a method for computing a coupling noise voltage.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the specific embodiments of the present invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the present invention.

Figure 1:
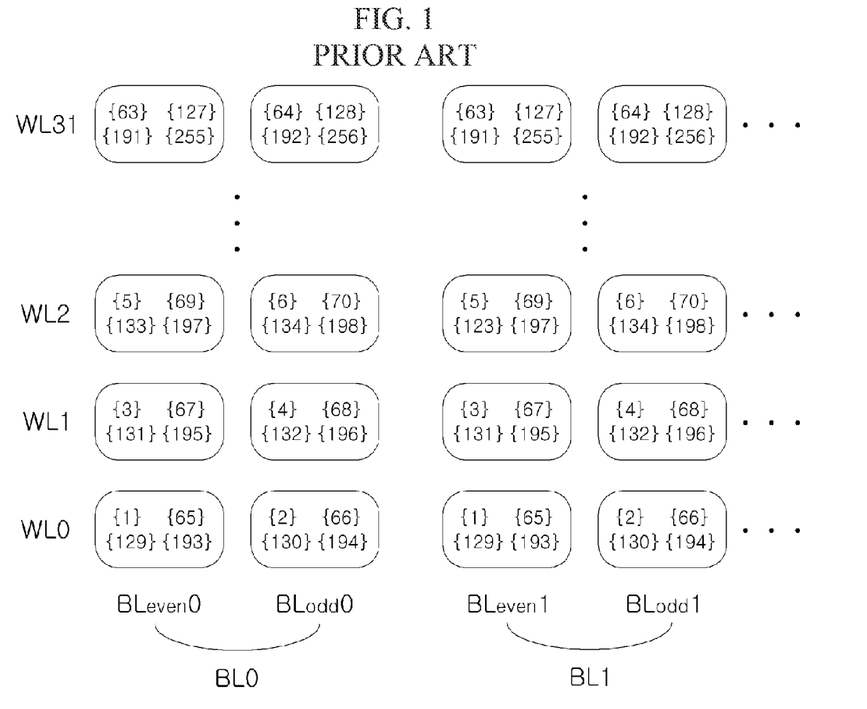
FIGS. 1 and 2 are schematic views illustrating the prior art of inputting data in a plurality of multi-level cells of a flash memory device.
Figure 2:
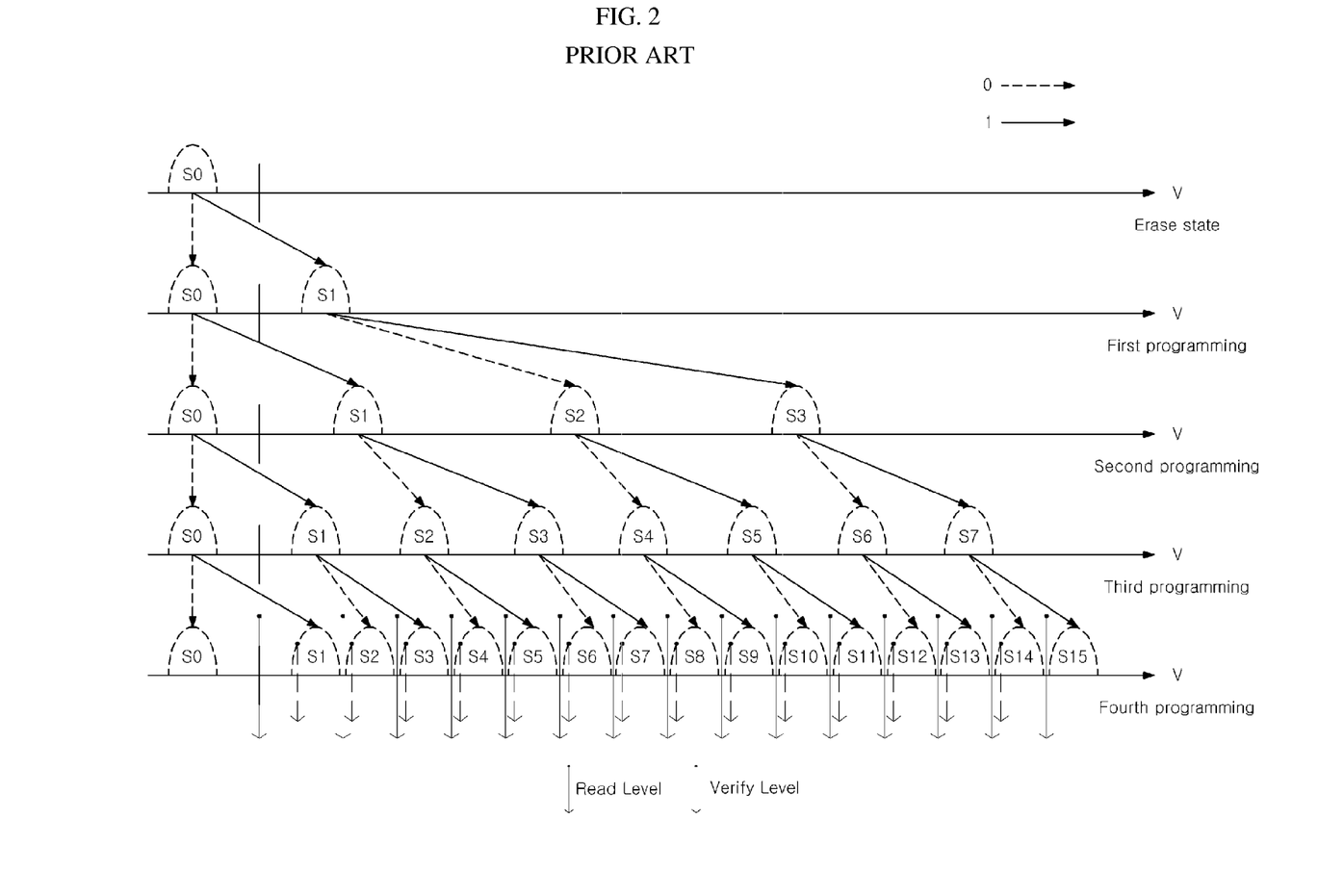

FIGS. 1 and 2 are schematic views illustrating the prior art of inputting data in a plurality of multi-level cells of a flash memory device (i.e., programming the multi-level cells).

For the purposes of explanation, FIGS. 1 and 2 illustrates the prior art of programming the multi-level cells mainly with, for example, a flash memory where the multi-level cell is a 16-level cell and the multi-level cells are arranged in 32 word lines WL and 4096 bit lines BL. However, embodiments of the present invention are not limited thereto.

Referring to FIG. 1, the 16-level cells (hereinafter, referred to as cells) are arranged on the 32 word lines WL and 4096 bit lines BL. The bit line BL includes an even bit line $BL_{even}$ and an odd bit line $BL_{odd}$.

According to the prior art programming technology, programming cells are conducted with a page as a unit. For example, in the case of the 16-level cell, programming may be conducted for 4 pages.

Moreover, in each page, cells on the same word line and on all even bit lines are simultaneously programmed, and cells on the same word line and on all odd bit lines are simultaneously programmed. In more detail, in each page, the cells on the same word line and on all even lines are first simultaneously programmed, and the cells on the same word line and all odd lines are then simultaneously programmed.

This programming operation is conducted in a direction of increase of a word line index or in a direction of decrease of a word line index.

Detailed explanations of an example of programming operations for the cells with reference to FIG. 1 are as follows.

First, explanation of a programming operation for a first page is that cells on a word line 0 WL0 and on all even bit lines is first programmed, and cells on the word line 0 WL0 and all odd bit lines are then programmed. Subsequently, the same programming operation as above is conducted for word line 1 WL1 to word line 31 WL31, and thus programming the cells for the first page is finished (the first page: {1} to {64}).

Subsequently, cell programming operations for second to fourth pages are conducted in the same sequence as the programming operation for the first page (the second page: {65} to {128}, the third page: {129} to {192}, and the fourth page: {193} to {256}), and thus the programming operations for four pages are finished.

It is explained in FIG. 1 that the cell programming operation is conducted in a direction from the word line 0 to the word line 31. However, according to another embodiment, the cell programming operation may be conducted in a direction from the word line 31 to the word line 0.

Since the cell programming operation in pages can be conducted through conventional various methods, detailed explanations thereof are omitted.

When the cells are programmed as explained in FIGS. 1 and 2, a coupling noise voltage occurs in each cell because of programming operations for neighboring cells. This coupling noise voltage should be eliminated because it interrupts accurately reading data. Hereinafter, embodiments of the present invention for computing a coupling noise voltage occurring in cells are explained with reference to FIG. 3.

Figure 3:
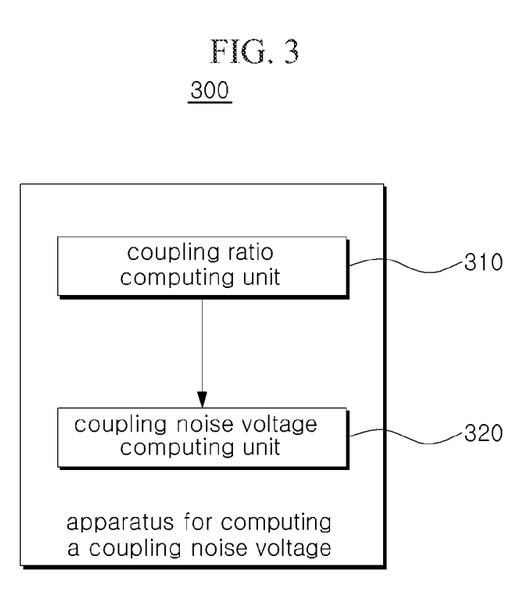
FIG. 3 is a block diagram illustrating a schematic configuration of an apparatus for computing a coupling noise voltage according to an embodiment of the present invention.

FIG. 3 is a block diagram illustrating a schematic configuration of an apparatus for computing a coupling noise voltage according to an embodiment of the present invention.

Referring to FIG. 3, an apparatus 300 for computing a coupling noise voltage includes a coupling ratio computing unit 310 and a coupling noise voltage computing unit 320.

For the purposes of explanation, embodiments of the present invention are explained mainly with an example that computes a coupling noise voltage occurring in a cell located at a coordinate [i, j] among a plurality of multi-level cells arranged on a plurality of word lines and a plurality of bit lines (where i means an index of word line that is an integer of 1 or more, and j means an index of bit line that is an integer of 1 or more). However, it would be obvious to one of ordinary skill in the art that disclosure as explained below can be commonly applied to other all cells in the flash memory device as well as the cell at [i, j].

First, the coupling ratio computing unit 310 computes coupling ratios between the cell at [i, j] and K neighboring cells to the cell at [i, j] (where K is an integer of 1 or more). Thus, k coupling ratios are computed.

In other words, since a coupling noise voltage occurs in a target cell because of programming operations of neighboring cells as explained above, the coupling ratio computing unit 310 computes coupling ratios that indicate an extent of a coupling noise voltage occurring in the cell at [i, j] because of the programming operations of the neighboring cells. The coupling noise voltage may be a floating gate (FG) coupling noise voltage.

In the embodiment of the present invention, the neighboring cells to the cell at [i, j] may be configured differently depending on position of the cell at [i, j].

Figure 4:
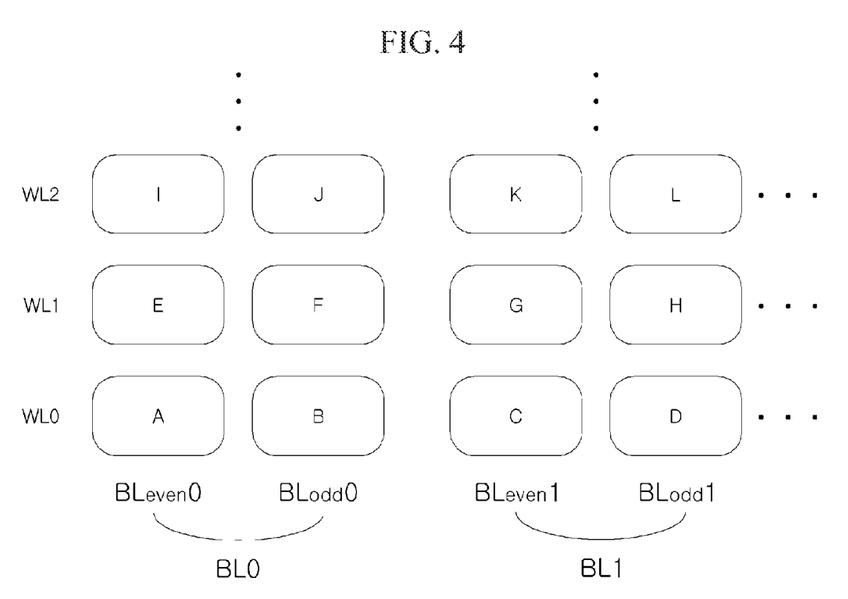
FIG. 4 is a view illustrating operation concept of an apparatus for computing a coupling noise voltage according to an embodiment of the present invention.

For example, in the case that the plurality of cells are arranged as shown in FIG. 4, and cell programming operations are conducted in a direction from a word line 0 to a high rank word line, when the cell at [i, j] is a cell G located on an even bit line, neighboring cells to the cell at [i, j] may be set as a cell J at left and upper side, a cell K at middle and upper side, and a cell L right and upper side, with respect to the cell at [i, j] (in this case, K=3), or the above-described 3 cells (i.e., the cells J, K and L) and a cell F at a left side and a cell H at a right side with respect to the cell at [i, j] (in this case, K=5).

Alternatively, in the case that the plurality of cells are arranged as shown in FIG. 4, and cell programming operations are conducted in a direction from a word line 0 to a high rank word line, when the cell at [i, j] is a cell F located on an odd bit line, neighboring cells to the cell at [i, j] may be set as a cell I at left and upper side, a cell J at middle and upper side, and a cell K right and upper side, with respect to the cell at [i, j] (in this case, K=3).

However, it should be understood that neighboring cells to the cell at [i, j] can have various combinations other than the above-described combinations.

Hereinafter, for the purposes of explanation, explanations are made assuming that when the cell at [i, j] is located on an even bit line, 5 cells located at upper-left, upper-middle, upper-right, left and right with respect to the cell at [i, j] are set as neighboring cells to the cell at [i, j], and when the cell at [i, j] is located on an odd bit line, 3 cells located at upper-left, upper-middle and upper-right with respect to the cell at [i, j] are set as neighboring cells to the cell at [i, j]. However, the present invention is not limited thereto.

The coupling noise voltage computing unit 320 computes a coupling noise voltage value occurring in the cell at [i, j] using the K coupling ratios.

In more detail, the coupling noise voltage computing unit 320 multiplies voltage variation values (hereinafter, referred to as second voltage variation values, and first voltage variation values are explained below) of the K neighboring cells by the K coupling ratios, respectively, adds them, and computes the added value as a coupling noise voltage value occurring in the cell at [i, j].

According to the embodiment of the present invention, each of the K second voltage variation values may be a variation value (i.e., a voltage variation value) between a voltage value of a $n^{th}$ page of and a voltage value of a $(n-1)^{th}$ page of each of the K neighboring cells (where n is an integer of 2 or more).

In this case, the voltage value of the $n^{th}$ page of the neighboring cell may be a voltage value directly measured, or a representative voltage value (which is predetermined) that represents a voltage range including a voltage value directly measured.

The voltage value of the $(n-1)^{th}$ page of the neighboring cell may be a voltage value directly measured, or a representative voltage value (which is predetermined) that represents a voltage range including a voltage value directly measured. Besides, the voltage value of the $(n-1)^{th}$ page of the neighboring cell may be a voltage value that is derived from a voltage value of the $n^{th}$ page using a predetermined relation between a voltage value of the $n^{th}$ page and a voltage value of the $(n-1)^{th}$ page.

Moreover, it is preferred that n is an index of a page that is finally conducted. For example, n is 4 when programming 16-level cells. This is because, generally, when programming a page previous to a final page, a coupling noise voltage is offset by a verify operation for programming the next page.

For example, in the case that the cell at [i, j] is located on an even bit line, a coupling noise voltage value occurring in the cell at [i, j] may be computed through a following first expression. Moreover, in the case that the cell at [i, j] is located on an odd bit line, a coupling noise voltage value occurring in the cell at [i, j] may be computed through a following second expression.

The first expression is:

$$\Delta V_{th}^{(i,je)} = \gamma_{fg1}\Delta v_{th}^{(i+1,je)} + \gamma_{fg2}\Delta v_{th}^{(i+1,je-1)} + \gamma_{fg2}\Delta v_{th}^{(i+1,je+1)} + \gamma_{fg3}\Delta v_{th}^{(i,je-1)} + \gamma_{fg3}\Delta v_{th}^{(i,je+1)}$$

The second expression is:

$$\Delta V_{th}^{(i,jo)} = \gamma_{fg1}\Delta v_{th}^{(i+1,jo)} + \gamma_{fg2}\Delta v_{th}^{(i+1,jo-1)} + \gamma_{fg2}\Delta v_{th}^{(i+1,jo+1)}$$

In the expressions, i is an index of word line, je is an index of even bit line (i.e., in the case of a cell located on an even bit line, j=je), jo is an index of odd bit line (i.e., in the case of a cell located on an odd bit line, j=jo), $\Delta V_{th}^{(i,je)}/\Delta V_{th}^{(i,jo)}$ is a coupling noise voltage value occurring in a cell at [i, je]/a cell at [i, jo], $\gamma_{fg1}$ is a coupling ratio between the cell at [i, je]/the cell at [i, jo] and a neighboring cell located at a middle-upper side, $\gamma_{fg2}$ is a coupling ratio between the cell at [i, je]/the cell at [i, jo] and a neighboring cell located in a diagonal direction thereof (i.e., a upper-right side, or upper-left side) $\gamma_{fg3}$ is a coupling ratio between the cell at [i, je]/the cell at [i, jo] and a neighboring cell located in a side direction thereof (i.e., a right side or left side), and $\Delta v_{th}^{(i+1,je)}$ is a second voltage variation value of a cell at [i+1, je] (other second voltage variation values can be inferred in the same manner).

Since the coupling ratio is proportional to the coupling noise voltage, in order for the coupling noise voltage computing unit 320 to more accurately compute the coupling noise voltage value, the coupling ratio computed by the coupling ratio computing unit 310 should have an accurate value.

To do this, the coupling ratio computing unit 310 may compute K coupling ratios such that a difference value between a first coupling noise voltage value and a second coupling noise voltage value is minimized, wherein the first coupling noise voltage value is computed using a voltage value of a test cell at a coordinate [i, j] among a plurality of test cells included in a test flash memory and the second coupling noise voltage value is computed using voltage variation values (hereinafter, referred to as first voltage variation values) of K neighboring test cells to the test cell at [i, j] and K coupling ratios.

In other words, the coupling ratio computing unit 310 may predict a coupling noise voltage value (i.e., the first coupling noise voltage value) occurring in the test cell at [i, j] using a voltage value of the test cell at [i, j] itself and compute a coupling noise voltage value (i.e., the second coupling noise voltage) occurring in the test cell at [i, j] using voltage values of the K neighboring test cells (that are expressed in the K coupling ratios), and set the K coupling ratios such that the first coupling noise voltage values and the second coupling noise voltage values are made equal. Further, the coupling noise voltage computing unit 320 may compute the coupling noise voltage value of the cell at [i, j] using the coupling ratios set as above.

Detailed explanations thereof are as follows.

According to the embodiment of the present invention, the first coupling noise voltage value may be a difference value between a voltage value measured in a $n^{th}$ page of the test cell at [i, j] and a voltage value set in the $n^{th}$ page in the case that there occurs no coupling noise voltage in the test cell at [i, j]. For example, the first coupling noise voltage value may be expressed in a following third expression.

The third expression is:

$$\Delta V_{th}^{(i,j)} = V_{th,n}^{(i,j)} - V(n,k).$$

In the expression, $\Delta V_{th}^{(i,j)}$ is the first coupling noise voltage value, $V_{th,n}^{(i,j)}$ is the voltage value measured as above, and $V(n, k)$ is the voltage value set as above (k is one of S0 to S15 described in FIG. 2).

According to the embodiment of the present invention, the second coupling noise voltage value may be a value that is got by multiplying K first voltage variation values by K coupling ratios, respectively, and adding them. In this case, each of the K first voltage variation values may be a voltage variation value between a voltage value of a $n^{th}$ page of and a voltage value of a $(n-1)^{th}$ page of each of the K neighboring test cells. For example, when the test cell at [i, j] is located on an even bit line, the second coupling noise voltage value may be expressed in a following fourth expression.

The fourth expression is:

$$V_{CE}^{(i,je)} = \gamma_{FGe1}\Delta v_{th}^{(i+1,je)} + \gamma_{FGe2}\Delta v_{th}^{(i+1,je-1)} + \gamma_{FGe3}\Delta v_{th}^{(i+1,je+1)} + \gamma_{FGe4}\Delta v_{th}^{(i,je-1)} + \gamma_{FGe5}\Delta v_{th}^{(i,je+1)} = \gamma_{FGe1}\left(V_{th,n}^{(i+1,je)} - V_{th,n-1}^{(i+1,je)}\right) + \gamma_{FGe2}\left(V_{th,n}^{(i+1,je-1)} - V_{th,n-1}^{(i+1,je-1)}\right) + \gamma_{FGe3}\left(V_{th,n}^{(i+1,je+1)} - V_{th,n-1}^{(i+1,je+1)}\right) + \gamma_{FGe4}\left(V_{th,n}^{(i,je-1)} - V_{th,n-1}^{(i,je-1)}\right) + \gamma_{FGe5}\left(V_{th,n}^{(i,je+1)} - V_{th,n-1}^{(i,je+1)}\right)$$

In the expression, $\Delta V_{CE}^{(i,je)}$ is the second coupling noise voltage value, $\Delta v_{th}^{(i+1,je)}$ is a first voltage variation value of a neighboring test cell at [i+1, je] (other first voltage variation values ($\Delta v_{th}$) can be inferred in the same manner), $\gamma_{FGe1}$ to $\gamma_{FGe5}$ are K coupling ratios, and $V_{th,n}^{(i+1,je)}$ is a voltage value of a $n^{th}$ page of a neighboring test cell at [i+1, je] (voltage values ($V_{th}$) of other neighboring test cells can be inferred in the same manner).

In this case, the voltage value of the $n^{th}$ page of the neighboring test cell may be a voltage value directly measured, or a representative voltage value (which is predetermined) that represents a voltage range including a voltage value directly measured.

The voltage value of the $(n-1)^{th}$ page of the neighboring test cell may be a voltage value directly measured, or a representative voltage value (which is predetermined) that represents a voltage range including a voltage value directly measured. Besides, the voltage value of the $(n-1)^{th}$ page of the neighboring test cell may be a voltage value that is derived from a voltage value of the $n^{th}$ page using a predetermined relation between a voltage value of the $n^{th}$ page and a voltage value of the $(n-1)^{th}$ page.

The coupling ratio computing unit 310 sets the K coupling ratios such that a difference value between the first coupling noise voltage value and the second coupling noise voltage noise is minimized. According to the embodiment of the present invention, the coupling ratio computing unit 310 may compute convergence values, which are derived through conducting operations of computing K coupling ratios plural times repeatedly, as final K coupling ratios.

In more detail, the coupling ratio computing unit 310 may set certain initial values for K coupling ratios which is an initial step to compute the K coupling ratios, renew K coupling ratios plural times, and set specific values converging according to the renewal as K coupling ratios. In this case, K coupling ratios in a $(m+1)^{th}$ time (where m is an integer of 2 or more) may be computed by renewing K coupling ratios that are computed in a $m^{th}$ time using a difference value between the first coupling noise voltage value and the second coupling noise voltage value that are computed in the $m^{th}$ time.

In this case, various renewal algorithms may be used. For example, the coupling ratio computing unit 310 may conduct renewing K coupling ratios using an LMS (Least Mean Square) algorithm, and this may be expressed in a following fifth expression.

The fifth expression is:

$$\gamma_{FGeN,m+1} = \gamma_{FGeN,m} + \Theta \times e^{(i,je)} \times (V(n,k) - V(n-1,k))$$

In the expression, N is an index that indicates K coupling coefficients, $\gamma_{FGeN, m+1}$ is a renewed coupling ratio (i.e., a coupling ratio in a $(m+1)^{th}$ time), $\gamma_{FGeN, m}$ is a coupling ratio before renewing (i.e., a coupling ration in a $m^{th}$ time), $\Theta$ is a renewal coefficient used in the LMS algorithm, and $e^{(i,je)}$ is a difference value between a first coupling noise voltage value and a second coupling noise voltage value that are computed in the $m^{th}$ time.

Through the above process, the coupling ratio computing unit 310 can compute the K coupling ratios such that a difference between the first coupling noise voltage value and the second coupling noise voltage value is minimized. Further, by using the K coupling ratios derived as above, the coupling noise voltage computing unit 320 can compute a coupling noise voltage of the cell at [i, j] with high accuracy.

As described above, the coupling noise voltage computing unit 320 computes the coupling noise voltage occurring in the cell at [i, j] by multiplying the voltage variation values between the voltage values of the $n^{th}$ pages of and the voltage values of the $(n-1)^{th}$ pages of the K neighboring cells by the K coupling ratios, respectively, and, in this case, coupling noise voltages may occur in the K neighboring cells in common with the cell at [i, j]. In other words, the K neighboring cells are also affected by programming operations for their neighboring cells, and voltages measured in the K neighboring cells may thus include coupling noise voltages. Since the coupling noise voltages occurring in the K neighboring cells act as elements that interrupt accurately computing a coupling noise voltage occurring in the cell at [i, j], eliminating them is preferred.

Therefore, according to the embodiment of the present invention, the coupling noise voltage computing unit 320 may compute a coupling noise voltage occurring in the cell at [i, j] using not a voltage value measured in a $n^{th}$ page of each of the K neighboring cells but a voltage value that is got by eliminating a coupling noise voltage value occurring in each of the K neighboring cells from the measured voltage value.

To compute the coupling noise voltage value occurring in each of the K neighboring cells, the apparatus 300 for computing a coupling noise voltage may conduct the same operation of computing the coupling noise voltage as described above with each of the K neighboring cells as a target cell (i.e., like the cell at [i, j]).

In other words, the coupling ratio computing unit 310 may compute coupling ratios (i.e., L coupling ratios) between a first neighboring cell among the K neighboring cells and L respective neighboring cells to the first neighboring cell (where L is an integer of 2 or more), and the coupling noise voltage computing unit 320 may multiply voltage variation values (i.e., L voltage variation values) of the L neighboring cells by L coupling ratios, respectively, and add them, and compute the added value as a coupling noise voltage value occurring in the first neighboring cell.

This operation is conducted in common for all K neighboring cells, coupling noise voltage values occurring in the K neighboring cells are thus computed, and the coupling noise voltage computing unit 320 computes a coupling noise voltage value occurring in the cell at [i, j] using voltage values, which is got by eliminating the coupling noise voltages, of $n^{th}$ pages of the K neighboring cells.

Coupling noise voltages may occur in the L neighboring cells in common with the K neighboring cells. In this case, an operation of eliminating a coupling noise voltage may be conducted for each of the L neighboring cells in advance in the same manner as described above regarding the K neighboring cells.

In other words, according to the embodiment of the present invention, the L voltage variation values are voltage variation values between voltage values of $n^{th}$ page of and voltage values of $(n-1)^{th}$ pages of the L respective neighboring cells. The voltage value of the $n^{th}$ page of each of the L neighboring cells may be a voltage value measured in the $n^{th}$ page of each of the L neighboring cells, or a voltage value that is got by eliminating a coupling noise voltage value occurring in each of the L neighboring cells from the voltage value measured in the $n^{th}$ page of each of the L neighboring cells.

According to the inventor research, it is most efficient that repeated eliminating operations of coupling noise voltages are performed up to a level for the K neighboring cells.

In summary, the apparatus 300 for computing a coupling noise voltage according to the embodiment of the present invention may sequentially conduct following operations to compute a coupling noise voltage value occurring in the cell at [i, j]:

i) computing voltage variation values of neighboring cells to neighboring cells to the cell at [i, j];

ii) computing coupling noise voltage values occurring in the neighboring cells using the voltage variation values of the neighboring cells to the neighboring cells, and, by using it, computing voltage values that are got by eliminating the coupling noise voltages of the neighboring cells;

iii) computing voltage variation values of the neighboring cells using the voltage values that are got by eliminating the coupling noise voltages of the neighboring cells; and iv) computing a coupling noise voltage occurring in the cell at [i, j] using the voltage variation values of the neighboring cells.

Figure 5:
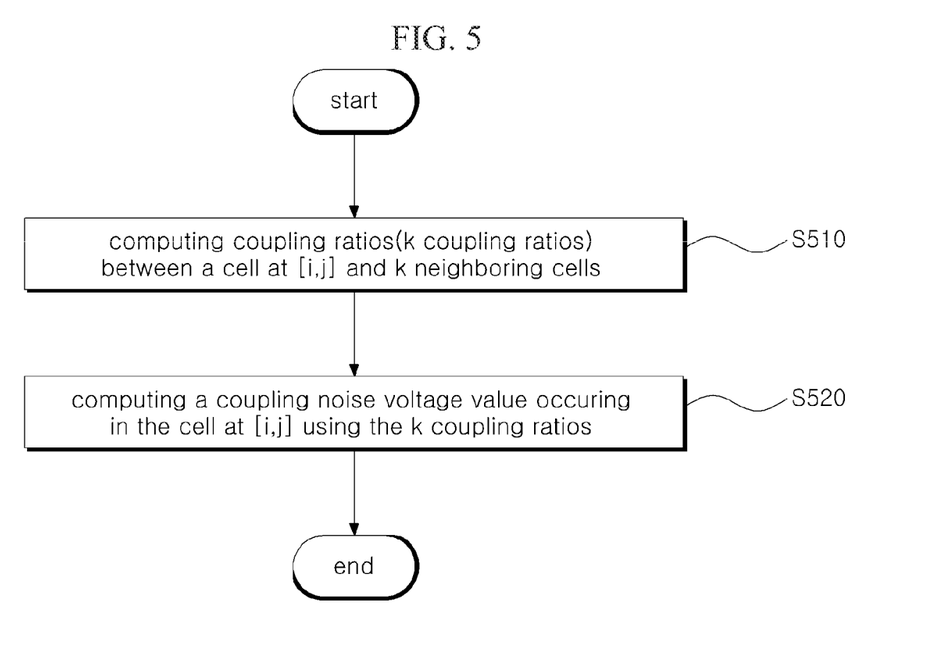
FIG. 5 is a flow chart illustrating a method of computing a coupling noise voltage according to the embodiment of the present invention.

FIG. 5 is a flow chart illustrating a method of computing a coupling noise voltage according to the embodiment of the present invention. Hereinafter, processes conducted in respective steps are explained.

First, in a step S510, coupling ratios (i.e., K coupling ratios) between a cell at [i, j] and K neighboring cells to a cell at [i, j] among a plurality of cells, which are included in a flash memory device and arranged on a plurality of word lines and a plurality of bit lines, are computed.

In this case, each of the K coupling ratios has a value such that a difference value between a first coupling noise voltage value, which is computed using a voltage value of a test cell at [i, j] among a plurality of test cells included in a test flash memory, and a second coupling noise voltage value, which is computed using voltage variation values (i.e., K first voltage variation values) of K neighboring test cells to the test cell at [i, j] and K coupling ratios, is minimized.

Subsequently, in a step S520, a coupling noise voltage value occurring in the cell at [i, j] is computed using the K coupling ratios.

According to the embodiment of the present invention, in the step S520, a value, which is got by multiplying the voltage variation values (i.e., K second voltage variation values) of the K neighboring cells by the K coupling ratios and adding them, may be computed as a coupling noise voltage value occurring in the cell at [i, j].

In this case, the K second voltage variation values include voltage variation values between voltage values of $n^{th}$ pages of and voltage values of $(n-1)^{th}$ pages of the K respective neighboring cells, the voltage value of the $n^{th}$ page of each of the K neighboring cells may be a voltage value that is got by eliminating a coupling noise voltage value occurring in each of the K neighboring cells from a voltage value measured in the $n^{th}$ page of each of the K neighboring cells.

Moreover, according to the embodiment of the present invention, the first coupling voltage value may be a difference value between a voltage value measured in a $n^{th}$ page of the test cell at [i, j], and a voltage value set in the $n^{th}$ page in the case that there occurs no coupling noise voltage in the test cell at [i, j], and the second coupling noise voltage value may be a value that is got by multiplying the K first voltage variation values by the K coupling ratios, respectively, and adding them. In this case, each of the K first voltage variation values may be a voltage variation value between the voltage value of the $n^{th}$ page of and the voltage value of $(n-1)^{th}$ page of each of the K neighboring test cells.

Moreover, according to the embodiment of the present invention, in the step S510, coupling ratios (i.e., L coupling ratios) between a first neighboring cell among the K neighboring cells and L respective neighboring cells to the first neighboring cell may be computed (where L is an integer of 2 or more). In this case, in the step 520, a value, which is got by multiplying voltage variation values (i.e., L voltage variation values) of the L neighboring cells by the L coupling ratios, respectively, and adding them, may be computed as a coupling noise voltage value occurring in the first neighboring cell.

Embodiments for the method for computing a coupling noise voltage according to the present invention are explained above, to which the configuration regarding the apparatus 300 for computing a coupling noise voltage as described in FIG. 3 may be applied. Accordingly, more detailed explanations of the method for computing a coupling noise voltage may be omitted.

Moreover, the embodiments of the present invention may be realized in form of program instruction that can be performed through various computer means, and be recorded on computer-readable media. The computer-readable media may include program instruction, data file, data structure and the like, singly or in combination. The program instruction recorded on the media may be one designed and configured specially for the present invention or one know to and usable by one of ordinary skill in the computer software art. The computer-readable recording media may include, for example, magnetic media such as hard disk, floppy disk and magnetic tape, optical media such as CD-ROM and DVD, magneto-optical media such as floptical disk, ROM, RAM, flash memory or the like. The program instruction may include, for example, a machine language code like one that is generated by a compiler, or a high-level language code that is executed by a computer using an interpreter or the like. The aforementioned hardware device may be configured to be operated as at least one software module to execute operations of the embodiments of the present invention, and vice versa.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An apparatus for computing a coupling noise voltage occurring in a plurality of cells arranged on a plurality of word lines and a plurality of bit lines in a flash memory device, the apparatus comprising:
   a coupling ratio computing unit that computes K coupling ratios between a cell located at a coordinate [i, j] and K neighboring cells to the cell at [i, j], wherein K is an integer of 1 or more, and the K coupling ratios indicate an extent of a coupling noise voltage occurring in the cell located at a coordinate [i j] due to programming operations of the neighboring cells of the cell at [i, j]; and
   a coupling noise voltage computing unit that computes a coupling noise voltage value occurring in the cell at [i, j] using the K coupling ratios, wherein the computed coupling noise voltage value is eliminated from a voltage value detected while reading data from the cell at [i, j],
   wherein the coupling ratio computing unit computes the K coupling ratios such that each of the K coupling ratios has a value such that a difference value between a first coupling noise voltage value and a second coupling noise voltage value is minimized, wherein the coupling ratio computing unit further computes the first coupling noise voltage using a voltage value of a test cell at a coordinate [i, j] among a plurality of test cells in a test flash memory device, wherein the plurality of test cells in the test flash memory device and the plurality of cells in the flash memory device are of a same structure, and computes the second coupling noise voltage value using K first voltage variation values of K neighboring test cells to the test cell at [i, j] and the K coupling ratios before renewing values of the K coupling ratios,
   and wherein the coupling ratio computing unit and the coupling noise voltage computing unit are embodied on a hardware processor.

2. The apparatus according to claim 1, wherein the coupling noise voltage computing unit computes a value, which is got by multiplying K second voltage variation values of the K neighboring cells by the K coupling ratios and adding them, as the coupling noise voltage value occurring in the cell at [i, j].

3. The apparatus according to claim 2, wherein the plurality of cells are programmed with a page as a unit,
and each of the K second voltage variation values includes a voltage variation value between a voltage value of a nth page of and a voltage value of a (n−1)th page of each of the K neighboring cells, and wherein n is an integer of 2 or more.

4. The apparatus according to claim 3, wherein the voltage value of the nth page of each of the K neighboring cells includes a voltage value measured in the nth page of each of the K neighboring cells.

5. The apparatus according to claim 3, wherein the voltage value of the nth page of each of the K neighboring cells includes a voltage value that is got by eliminating a coupling noise voltage value occurring in each of the K neighboring cells from a voltage value measured in the nth page of each of the K neighboring cells.

6. The apparatus according to claim 5, wherein the coupling ratio computing unit computes L coupling ratios between a first neighboring cell among the K neighboring cells and L neighboring cells to the first neighboring cell,
and the coupling noise voltage computing unit computes a value, which is got by multiplying L voltage variation values of the L neighboring cells by the L coupling ratios and adding them, as a coupling noise voltage value occurring in the first neighboring cell, and wherein L is an integer of 2 or more.

7. The apparatus according to claim 6, wherein each of the L voltage variation values includes a voltage variation value between a voltage value of the nth page of and a voltage value of the (n−1)th page of each of the L neighboring cells,
and the voltage value of the nth page of each of the L neighboring cells includes a voltage value measured in the nth page of each of the L neighboring cells, or a voltage value which is got by eliminating a coupling noise voltage value occurring in each of the L neighboring cells from a voltage value measured in the nth page of each of the L neighboring cells.

8. The apparatus according to claim 1, wherein the plurality of test cells are programmed with a page as a unit,
and the first coupling noise voltage value includes a difference value between a voltage value measured in a nth page of the test cell at [i, j] and a set voltage value in the nth page when there occurs no coupling noise voltage in the test cell at [i, j].

9. The apparatus according to claim 1, wherein the plurality of test cells are programmed with a page as a unit,
and the second coupling noise voltage value includes a value that is got by multiplying the K first voltage variation values by the K coupling ratios and adding them.

10. The apparatus according to claim 9, wherein each of the K first voltage variation values includes a voltage variation value between a voltage value of a nth page of and a voltage value of a (n−1)th value of each of the K neighboring test cells.

11. The apparatus according to claim 1, wherein the coupling noise voltage
computing unit computes convergence values, which are derived by conducting operation of computing the K coupling ratios plural times repeatedly, as the K coupling ratios.

12. The apparatus according to claim 11, wherein the K coupling ratios in a (m+1)th time are computed by renewing the K coupling ratios computed in a mth time using a difference value between the first coupling noise voltage value and the second coupling noise voltage value that are computed in the mth time.

13. The apparatus according to claim 12, wherein renewing the K coupling ratios is conducted using a LMS (Least Mean Square) algorithm.

14. A method for computing a coupling noise voltage occurring in a plurality of cells arranged on a plurality of word lines and a plurality of bit lines in a flash memory device, the method comprising:
computing K coupling ratios between a cell located at a coordinate [i, j] and K neighboring cells to the cell at [i, j], wherein K is an integer of 1 or more and the K coupling ratios indicate an extent of a coupling noise voltage occurring in the cell located at a coordinate [i, j] due to programming operations of the neighboring cells of the cell at [i, j]; and
computing a coupling noise voltage value occurring in the cell at [i, j] using the K coupling ratios,
wherein each of the K coupling ratios is computed such that each has a value such that a difference value between a first coupling noise voltage value and a second coupling noise voltage value is minimized, and wherein computing the K coupling ratios further comprises:
computing the first coupling noise voltage using a voltage value of a test cell at a coordinate [i, j] among a plurality of test cells in a test flash memory device, wherein the plurality of test cells in a test flash memory device and the plurality of test cells in the flash memory device are of a same structure, and
computing the second coupling noise voltage value using K first voltage variation values of K neighboring test cells to the test cell at [i, j] and the K coupling ratios before renewing values of the K coupling ratios,
and wherein:
the computed coupling noise voltage value is eliminated from a voltage value detected while reading data from the cell at [i, j], and
the steps of computing the K coupling ratios and computing the coupling noise voltages are performed using a hardware processor.

15. The method according to claim 14, wherein computing the coupling noise voltage value computes a value, which is got by multiplying K second voltage variation values of the K neighboring cells by the K coupling ratios and adding them, as the coupling noise voltage value occurring in the cell at [i, j].

16. The method according to claim 15, wherein the plurality of cells are programmed with a page as a unit,
and each of the K second voltage variation values includes a voltage variation value between a voltage value of a nth page of and a voltage value of a (n−1)th page of each of the K neighboring cells,
wherein the voltage value of the nth page of each of the K neighboring cells includes a voltage value that is got by eliminating a coupling noise voltage value occurring in each of the K neighboring cells from a voltage value measured in the nth page of each of the K neighboring cells, and wherein n is an integer of 2 or more.

17. The method according to claim 16, wherein computing the K coupling ratios computes L coupling ratios between a first neighboring cell among the K neighboring cells and L neighboring cells to the first neighboring cell,
and computing the coupling noise voltage value computes a value, which is got by multiplying L voltage variation values of the L neighboring cells by the L coupling ratios and adding them, as a coupling noise voltage value occurring in the first neighboring cell, and wherein L is an integer of 2 or more.

18. The method according to claim 14, wherein the plurality of test cells are programmed with a page as a unit,
and the first coupling noise voltage value includes a difference value between a voltage value measured in a nth page of the test cell at [i, j] and a voltage value set in the nth page when there occurs no coupling noise voltage in the test cell at [i, j].

19. The method according to claim 14, wherein the plurality of test cells are programmed with a page as a unit,
and the second coupling noise voltage value includes a value that is got by multiplying the K first voltage variation values by the K coupling ratios and adding them,
and each of the K first voltage variation values includes a voltage variation value between a voltage value of a nth page of and a voltage value of a (n−1)th value of each of the K neighboring test cells.

20. A non-transitory computer-readable medium comprising computer code configured to cause the hardware processor to execute the method according to claim 14.

* * * * *